United States Patent [19]
Misic

[11] Patent Number: 4,684,895
[45] Date of Patent: Aug. 4, 1987

[54] INTERFACE SYSTEM FOR NMR SPECTROMETER AND QUADRATURE PROBE

[75] Inventor: George J. Misic, Hiram, Ohio

[73] Assignee: Picker International, Inc., Highland Hts., Ohio

[21] Appl. No.: 762,306

[22] Filed: Aug. 5, 1985

[51] Int. Cl.$^4$ ............................................. G01R 33/20
[52] U.S. Cl. .................................. 324/322; 324/309; 333/104
[58] Field of Search ............... 324/307, 309, 310, 313, 324/314, 318, 322; 333/103, 104; 307/256, 259, 317 R, 475; 455/39

[56] References Cited

U.S. PATENT DOCUMENTS

| | | | |
|---|---|---|---|
| 3,039,048 | 6/1962 | Shoolery | 324/0.5 |
| 4,297,637 | 10/1981 | Crooks | 324/309 |
| 4,408,162 | 10/1983 | Egger | 324/318 |
| 4,452,250 | 6/1984 | Chance et al. | 128/653 |
| 4,467,282 | 8/1984 | Siebold | 324/309 |

FOREIGN PATENT DOCUMENTS

| | | |
|---|---|---|
| 0071896 | 2/1983 | European Pat. Off. . |
| 0180121 | 5/1986 | European Pat. Off. . |
| 0196134 | 10/1986 | European Pat. Off. . |
| 2636969 | 2/1978 | Fed. Rep. of Germany . |

OTHER PUBLICATIONS

Moores et al., "VHF Pulsed Magnetic Resonance Duplexers", Review of Scientific Instruments, vol. 42, No. 9, Sep. 1971, pp. 1329-1333.

Kan et al., "A Versatile and Inexpensive Electronic System for a High Resolution NMR Spectrometer", Review of Scientific Instruments, vol. 44, No. 12, Dec. 1973, pp. 1725-1733.

"A Fast Recovery Pulsed Nuclear Magnetic Resonance Sample Probe Using a Delay Line", Lowe et al, Rev. Sci. Instr., vol. 45, No. 5, pp. 631-639, May 1974.

Quadrature Detection Coils-A Further $\sqrt{2}$ Improvement in Sensitivity; Chen, Hoult & Sank, J. of Mag. Res. 54, pp. 324-327 (1983).

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

In a magnetic resonance imager or other spectrometer, an interface (D) selectively connects quadrature probe coils (E) with a transmitter (C) and with a receiver (F). The interface includes a first RF switch (10), such as a first PIN diode (12) which has a low radio frequency impedance state for passing transmitted radio frequency signals to the probe coils and a high radio frequency impedance state for blocking the passage of radio frequency signals to the probe coils. A quarter wave length cable (20) or the equivalent is connected between the probe coils to shift the phase of the radio frequency signals 90 degrees. A second radio frequency switch (40) includes a second quarter wave length cable (42) and a second pin diode (44) which selectively pass and block radio frequency signals from passing between the probe coils and the receiver. A third pin diode (52) selectively connects a third quarter wave length cable (54) with ground to provide a band pass filter in the transmit mode and causes the third quarter wave length cable to be connected to ground through a fourth quarter wave length cable (60) in the receive mode to provide a band stop filter. A control (G) selectively biases the PIN diodes between their conductive and non-conductive states to establish the transmit and receive modes.

20 Claims, 4 Drawing Figures

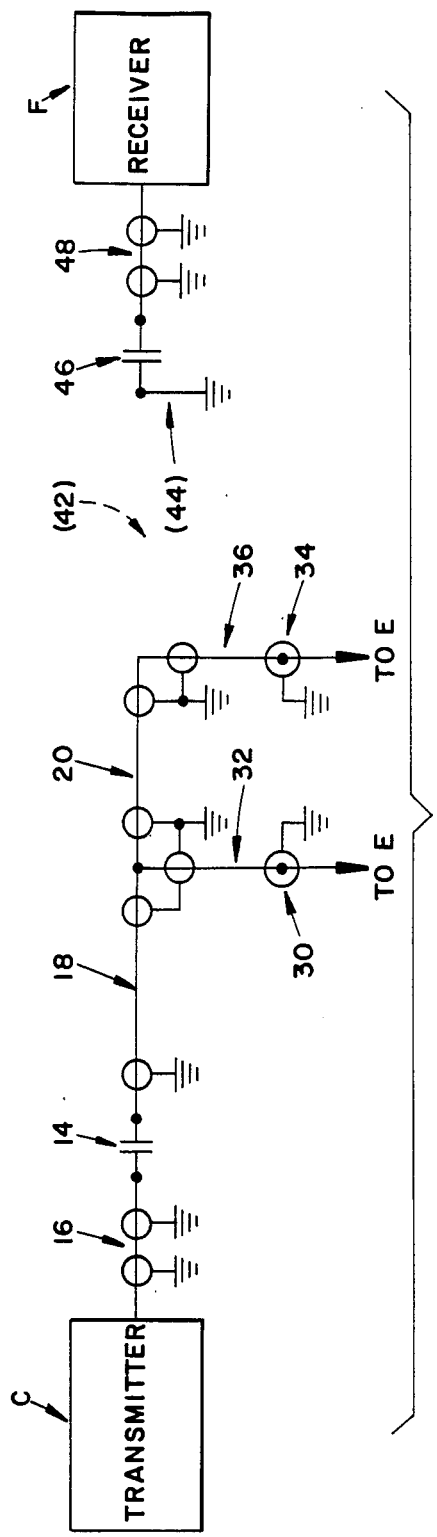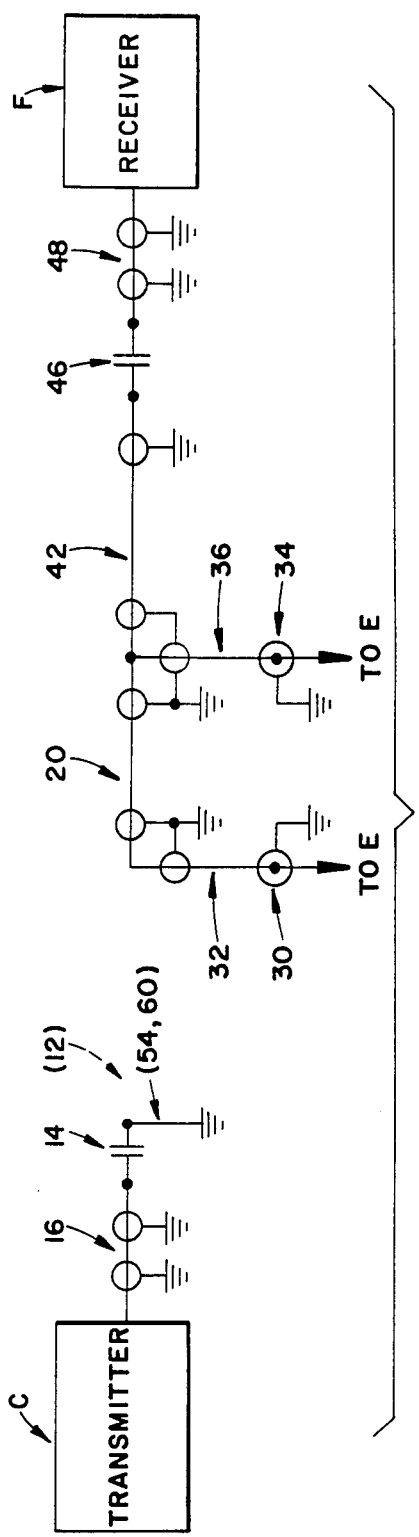

INTERFACE SYSTEM FOR NMR SPECTROMETER AND QUADRATURE PROBE

BACKGROUND OF THE INVENTION

The present invention relates to the art of radio frequency interface circuits. The invention finds particular application in interfacing between the transmission and receipt of magnetic resonance spectroscopy probe signals and will be described with particular reference thereto. It is to be appreciated, however, that the present invention will find application in magnetic resonance imaging, magnetic resonance chemical or physical analysis, and other applications in which the same coils function alternately as radio frequency transmission and reception antennae.

Usually, magnetic resonance spectrometers have used linear RF polarization for simplicity of design, although worthwhile gains can be had by using quadrature coils. Heretofore, magnetic resonance spectrometers using quadrature coils have commonly included a source of radio frequency driving signals that include two components which are offset by 90 degrees. A radio frequency transmitter and a signal splitter or divider are frequently employed to achieve this phase shift. The two radio frequency transmission signal components are conveyed through parallel circuits and parallel matching networks to a pair of quadrature probes. The quadrature probes are connected to parallel reception paths. The reception paths might each include a quarter wave line and diode terminations or other means to function as a double throw switch for switching between transmitting and receiving. Moreover, each parallel path may include a preamplifier, rectifier, analog-to-digital converter, and other receiver and signal processing components.

One of the disadvantages of the prior arts systems was the inability to maintain signal fidelity over a wide range of signal strengths, e.g. a 50 db RF envelope. The prior arts systems tended to distort low level portions of the envelope by causing distortion of the pulse shape, alterations in the relative amplitude, clipping of wave portions, or even loss of signal portions entirely.

Another problem resides in incomplete isolation of the transmitter and receiver. The transmitter may degrade the received signals increasing the noise level of the radio frequency signal. The increased noise may be attributable to the injection of noise into the receiver from the transmitter or the loading of the probe output by the transmitter.

Still further difficulties arise in selecting components which function satisfactorily adjacent high magnetic fields. Hybrid transformers, ferrite-core transformers, or other transformers incorporating high permeability materials become saturated by the high magnetic field associated with magnetic resonance imaging. Placing the transformers a sufficient distance from the magnetic field causes additional signal losses in the transmission lines and the possibility of phase shifts. The substitution of air core hybrid transformers complicates electronic design and tends to reduce performance.

The present invention provides a new and improved interface which eliminates the above referenced problems and others to achieve improved magnetic resonance imaging and spectroscopy.

SUMMARY OF THE INVENTION

In accordance with the present invention, an interface is provided for interfacing a magnetic resonance spectrometer and a radio frequency probe. A first RF switch means selectively passes and blocks the passage of radio frequency signals. The first RF switch means is operatively connected with a first probe port and is adapted to be connected with a radio frequency transmitter. A phase shift means for phase shifting radio frequency signals by a selected phase angle is operatively connected between the first RF switch means and a second probe port. A second RF switch means for selectively passing and blocking the passage of radio frequency signals is operatively connected with the second probe port and is adapted to be connected with a receiver. The first and second RF switch means are operated under control of a control means such that one RF switch means blocks the passage of radio frequency signals when the other is passing radio frequency signals.

In accordance with a more limited aspect of the present invention, a third RF switch means selectively switches a band pass filter means between the transmitter and the first RF switch means when the first RF switch means is passing radio frequency signals and a band stop filter when the first RF switch means is blocking the passage of radio frequency signals.

In accordance with another aspect of the present invention, an interface is provided. A first PIN diode has an anode operatively connectable with a radio frequency transmitter and a cathode operatively connected with a first port. A first quarter wave line operatively connects the first port with a second port. A second quarter wave line operatively connects the second port with an anode of a second PIN diode. The second PIN diode has a cathode operatively connected with ground. The second quarter wave line is operatively connectable with a radio frequency receiver.

In accordance with another more restrictive aspect of the present invention, the interface is incorporated in a magnetic resonance imaging apparatus. The imaging apparatus includes means for establishing a main magnetic field and means for establishing magnetic field gradients across the main magnetic field. A transmitter selectively supplies magnetic resonance excitation signals to the interface for transmission to quadrature probes connected with the first and second ports. A magnetic resonance spectrometer receiver is selectively switched into communication with the ports to receive signals from the quadrature probe. An image reconstruction means reconstructs an image of a magnetic resonance examined sample from the received signals for display on an appropriate image display means.

In accordance with another aspect of the present invention, an interface method is provided. The passage of radio frequency signals to first and second ports is selectively permitted or blocked. The phase of the signals is shifted by a preselected phase angle between the first and second ports. During transmission, the first port leads the second port by the preselected phase angle. During reception, radio frequency signals received at the first port lag radio frequency signals received at the second port by the preselected phase angle. The passage of received radio frequency signals from the ports to a receiver is selectively permitted and blocked. More specifically, the passage of transmitted radio frequency signals to the ports is permitted when the passage of received radio frequency signals to the receiver is blocked and of the passage of received radio frequency signals to the receiver is permitted when the passage of transmitted radio frequency signals from the transmitter is blocked.

A first advantage of the present invention is that it provides excellent pulse fidelity over a wide range of signal strengths.

Another advantage of the present invention is that it provides improved isolation between transmission and reception.

Yet another advantage is that it facilitates the reconstruction of clearer, more detailed magnetic resonance images.

Other advantages reside in the ease of construction, testing, and implementation of the present invention.

Still further advantages will become apparent to those of ordinary skill in the art upon reading and understanding the following detailed description of the preferred embodiment.

BRIEF DESCRIPTION OF THE DRAWINGS

The invention may take form in various parts and arrangements of parts and in various steps and arrangements of steps. The drawings are only for purposes of illustrating a preferred embodiment and are not to be construed as limiting the invention.

FIG. 3 illustrates an equivalent circuit when the interface is in its transmit mode; and, FIG. 4 illustrates an equivalent circuit when the interface is in its receive mode.

DETAILED DESCRIPTION OF THE PREFERRED EMBODIMENT

Figure 1:
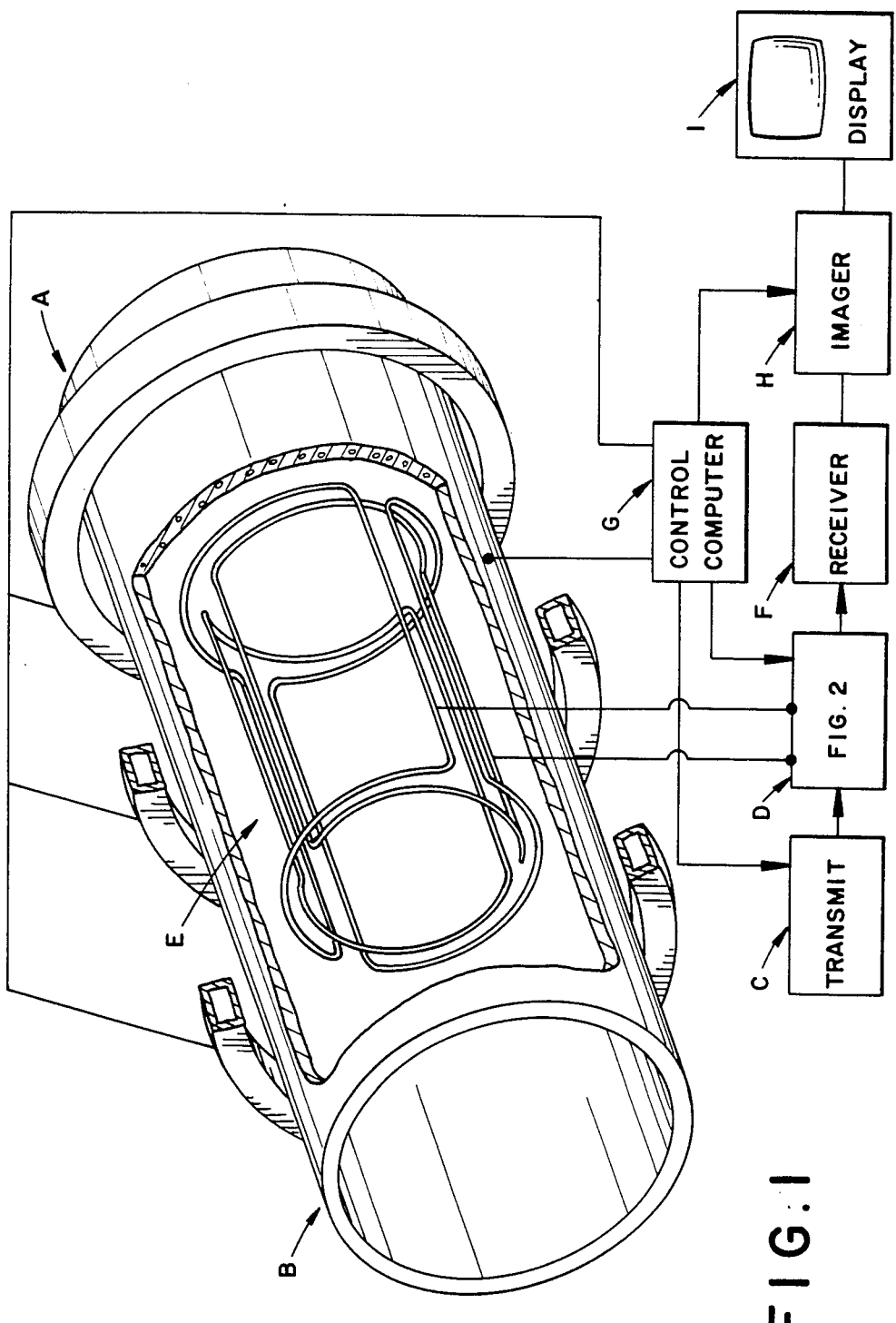
FIG. 1 is a diagramtic illustration of a magnetic resonance imaging apparatus.

With reference to FIG. 1, a magnetic resonance imaging apparatus includes a main field generating means A for generating a strong magnetic field longitudinally through an imaging region. A plurality of superconducting magnetics are arranged peripherally to define a generally cylinderical imaging region therein. A gradient coil means B selectively causes magnetic field gradients across the main magnetic field to provide position encoding. A magnetic resonance excitation transmitter C selectively transmits radio frequency, magnetic resonance exciting signals through an interface D to a probe E, such as quadrature coils. Between resonance exciting transmissions or pulses, the probe E receives magnetic resonance signals from the sample in the imaging region. The received signals are passed by the interface D, which is described in greater detail in conjuction with FIG. 2, to a receiver F. A control computer G controls the main magnetic field coils A, the gradient coil B, the transmitter C, the interface D, and the receiver F to provide the appropriate data for reconstruction. A conventional imager H reconstructs the received radio frequency signals into electronic data representative of the density, position, and other characteristics of resonating nuclei in the imaging region. A conventional monitor or other display means I displays images which are a composite of received nuclei data.

Figure 2:
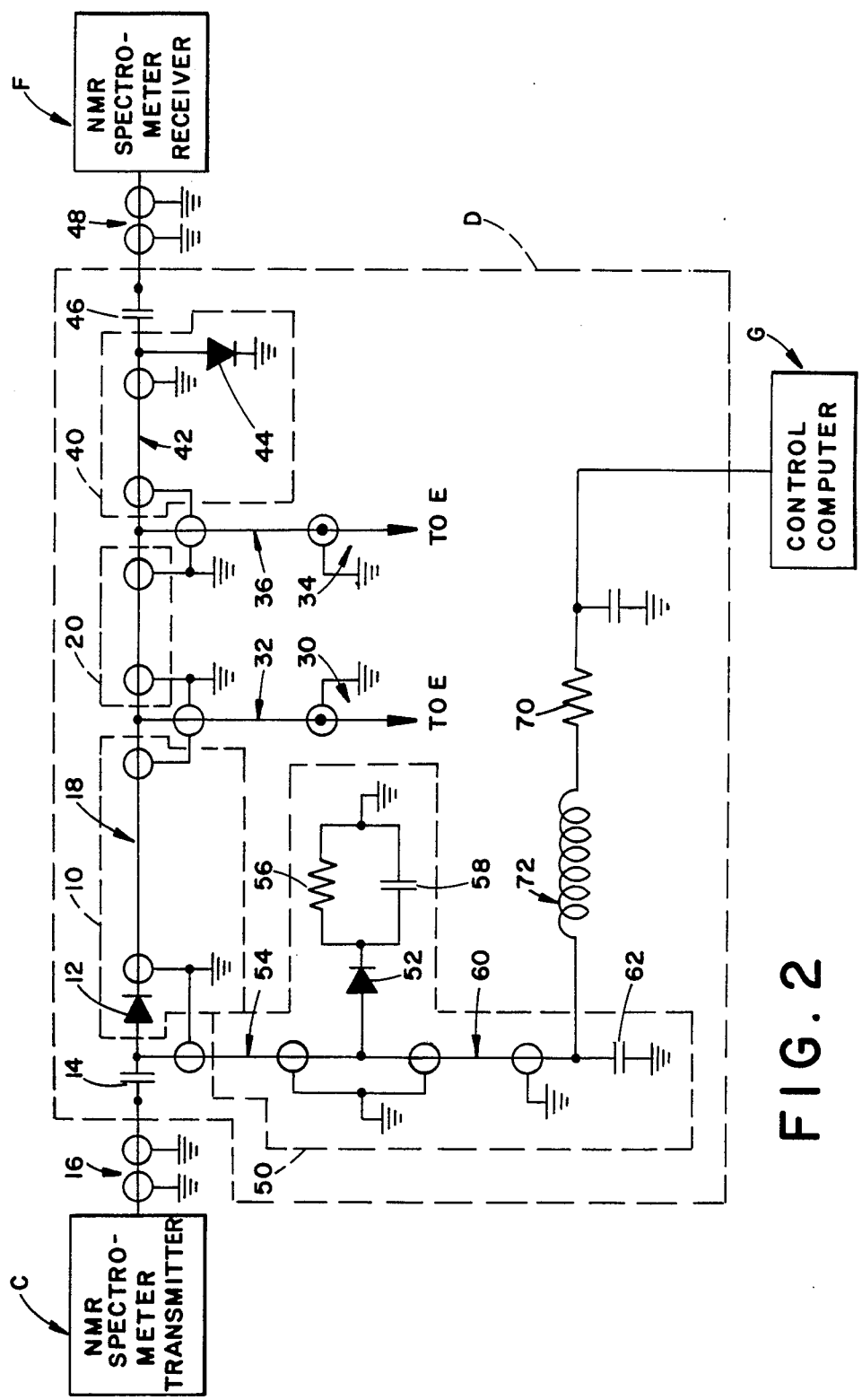
FIG. 2 is a circuit diagram of an interface in accordance with the present invention.

With reference to FIG. 2, the interface means D includes a first RF switch means 10 for selectively passing and blocking the passage of radio frequency signals from the transmitter C. In the preferred embodiment, the first RF switch means includes a first PIN diode 12 which is selectively biased between conducting and non-conducting states. The first PIN diode has an anode which is connected by a DC blocking capcitor 14 and a 50 ohm cable length 16 to the transmitter C. Preferably, a length of half wave length cable 18 may be connected with a cathode of the first PIN diode such that the diode may be positioned more remotely from the probe E.

A phase shift means 20 selectively shifts the phase of a received radio frequency signal by a preselected phase angle, in the preferred embodiment 90 degrees. The phase shift means 20 is connected with an end of the half wave length cable 18 opposite the first PIN diode 12. Further to the preferred embodiment, the phase shift means is a length of quarter wave length cable.

A first port 30 for interconnection with a first of the quadrature coils E is connected by a length of 100 ohm co-axial cable 32 with the first RF switch means 10 and the phase shift means 20. A second port 34 is connected by a length of 100 ohm cable 36 which is the same length as the first 100 ohm cable length 32 with the other end of the phase shift means 20. By positioning the phase shift means 20 between the two ports, the signal at the first port during transmission leads the second port signal by the selected phase angle. In the receive mode, the phase shift means causes the signal from the first port to lag the signal from the second port by the selected phase angle.

A second RF switch means 40 selectively passes radio frequency signals from the ports 30, 34 to the receiver F in a receive mode and blocks the passage of radio frequency signals in a transmit mode. In the preferred embodiment, the second RF switch means includes a length of quarter wave length cable 42 extending from the phase shift means 20 adjacent the second port 34 to an anode of a second PIN diode 44. The quarter wave length cable mirrors the impedance at the phase shift means end to the PIN diode end thereof. When the second PIN diode is gated conductive, the quarter wave length cable appears as an open circuit. When the second PIN diode 44 is gated non-conductive, the quarter wave length cable 42 functions as a 50 ohm matched transmission line. A DC blocking capacitor 46 and a length of 50 ohm co-axial cable 48 connect the second RF switch means 40 with the receiver F.

A filter means 50 improves signal quality in both the transmit and receive mode. The filter means includes a third RF switch means 52, such as a third PIN diode, which selectively switches a band pass filter into connection with the transmitter in the transmit mode and switches a band stop filter into connection with the transmitter in the receive mode. More particularly, a quarter wave length cable 54 is connected between the anode of the first PIN diode 12 and an anode of the third PIN diode 52. A cathode of the third PIN diode is connected by a resistor 56 and a DC blocking capacitor 58 with ground. When the third PIN diode is gated conductive, the quarter wave length cable 54 is effectively connected to ground. This produces the appearance of an open circuit to the transmitter at the operating frequency, hence functions as a band pass filter.

A fourth quarter wave length cable 60 and a DC blocking capacitor 62 are connected between the third quarter wave length cable 54 and ground. When the third PIN diode 52 is gated non-conductive, the third and fourth quarter wave length cables function effectively as a half wave length cable. The effective half wave length cable extends from the the first PIN diode anode through the DC blocking capacitor 62 to ground, thus forming a band stop filter. That is, the radio frequency signals from the transmitter are shorted to ground.

To place the interface D in the transmit mode, a DC bias voltage is applied to all the PIN diodes by the control means G to bias the diodes conductive. The bias voltage is applied through a resistor 70 and a radio frequency choke 72 to the junction of the fourth quarter wave cable 60 and the DC blocking capacitor 62. When the DC bias is removed, the PIN diodes are gated non-conductive and the interface is placed in the receive mode.

With particular reference to FIG. 3 and continuing reference to FIG. 2, in the transmit mode, the DC bias is applied to forward bias all of the PIN diodes into a region of very low radio frequency impedance. The value of the resistor 56 is selected such that all diodes are properly biased by the applied biasing potential. The third PIN diode 52 shorts the third quarter wave cable 54 to ground such that the cable appears as an open circuit. That is, the filter 50 functions as a band pass filter. The half wave length cable 18 acts as a 50 ohm transmission line from the transmitter C to the junction of the first probe cable 32 and the 90 degrees phase shift means 20. The first port 30 is driven 90 degrees ahead of the second port 34. The second quarter wave length cable 42 appears as an open circuit at the junction of the phase shift means 20 and the second port cable 36 because the second PIN diode 44 approximates a short circuit. This protects the receiver F from the power of the transmitted radio frequency signal.

With particular reference to FIG. 4 and secondary reference to FIG. 2, in the receive mode, a negative voltage biases all the PIN diodes to a very high radio frequency impedance. The third and fourth quarter wave length lines 54, 60 form a half wave length line placing an effective radio frequency short circuit at the output of the transmitter. The first PIN diode 12 appears as an essentially open circuit to prevent signals from flowing between the transmitter and the receiver. The first quarter wave length cable 20 delays the signal from the first port 30 by 90 degrees before the signals from the first and second ports are combined. The second quarter wave length cable 42 functions as a 50 ohm matched transmission line from the probes E to the receiver F. The second PIN diode 44 approximates an open circuit.

The invention has been described with reference to a preferred embodiment. Obviously, modifications and alterations will occur to those of ordinary skill in the art who have read and understood the preceding detailed description. It is intended that the invention be construed as including all such alterations and modifications in so far as they come within the scope of the appended claims or the equivalents thereof.

Having thus described a preferred embodiment, the invention is now claimed to be:

1. A magnetic resonance imaging apparatus for reconstructing man-readable images of an internal region of a sample, the apparatus comprising:
   means for establishing a strong, uniform main magnetic field in an imaging region;
   gradient field means for establishing magnetic field gradients across the main magnetic field in the imaging region;
   a radio frequency transmitter for selectively transmitting magnetic resonance exciting signals;
   a first RF switch means for selectively passing and blocking the passage of the radio frequency signals from the transmitter to a first probe;
   phase shift means for phase shifting the radio frequency signals by a selected phase angle, the phase shift means being operatively connected between the first probe and a second probe;
   a second RF switch means for selectively passing and blocking the passage of radio frequency signals, the second RF switch means being operatively connected with the second probe and a radio frequency receiver;
   control means for selectively gating the first RF switch means conductive and the second RF switch means non-conductive to achieve a transmit mode and for selectively gating the first RF switch means non-conductive and the second RF switch means conductive to achieve a receive mode;
   image reconstruction means operatively connected with the receiver for generating signals indicative of an image of an interior region of an object in the imaging region; and,
   a display means operatively connected with the image reconstruction means for producing a man-readable display from the image indicative signals.

2. The apparatus as set forth in claim 1 further including a third RF switch means for selectively connecting a band pass filter with the transmitter in the transmit mode and for selectively connecting a band stop filter with the transmitter in the receive mode.

3. An interface for interfacing a magnetic resonance spectrometer and a probe, the interface comprising:
   a first RF switch means for selectively passing and blocking the passage of radio frequency signals, the first RF switch means being operatively connected with a first probe port and adapted to be connected with a magnetic resonance spectrometer transmitter;
   a phase shift means for phase shifting radio frequency signals by a selected phase angle, the phase shift means being operatively connected between the first probe port and a second probe port;
   a second RF switch means for selectively passing and blocking the passage of radio frequency signals, the second RF switch means being operatively connected with the second probe port and adapted to be connected with a magnetic resonance spectrometer receiver; and,
   control means for selectively controlling the first and second RF switch means such that one RF switch means blocks the passage of radio frequency signals when the other RF switch means is passing radio frequency signals, whereby the magnetic resonance receiver is isolated from the probe ports when the transmitter is transmitting radio frequency signals to the probe ports with the radio frequency signals at the first port leading the radio frequency signals at the second port by the selected phase angle and whereby the magnetic resonance transmitter is isolated from the probe ports when the receiver is receiving radio frequency signals from the probe ports with the radio frequency signals from the first port lagging the radio frequency signals from the second port by the selected phase angle.

4. The interface as set forth in claim 3 further including a filter means for filtering radio frequency signals, the filter means being operatively connected with the first RF switch means.

5. The interface as set forth in claim 3 further including a third RF switch means for selectively switching the first RF switch means into communication with a band pass filter when the first RF switch means is passing radio frequency signals and with a band stop filter when the first RF switch means is blocking the passage of radio frequency signals.

6. The apparatus as set forth in claim 3 wherein the first and second RF switch means include PIN diodes.

7. The interface as set forth in claim 3 wherein the phase shift means shifts the phase 90 degrees.

8. The interface as set forth in claim 7 wherein the phase shift means is a quarter wave length cable.

9. The interface as set forth in claim 3 wherein the first RF switch means is a PIN diode having an anode operatively connectable with the transmitter and a cathode operatively connected with the first port; wherein the phase shift means includes a quarter wave length cable operatively connected between the first and second ports; and wherein the second RF switch means includes a second quarter wave length cable operatively connected at one end with the first quarter wave length cable and operatively connected at a second end with an anode of a second PIN diode and adapted to be connected with the receiver, a cathode of the second PIN diode being operatively connected with ground.

10. The interface as set forth in claim 3 further including a PIN diode for selectively switching one of a band pass and a band stop filter into communication with the transmitter.

11. The interface as set forth in claim 10 wherein the band pass filter includes a quarter wave length cable operatively connected between the first RF switch means and an anode of the PIN diode.

12. The interface as set forth in claim 11 wherein the band stop filter includes another quarter wave length cable operatively connected between the PIN diode anode and ground.

13. An interface comprising:
first and second coils for transmitting and receiving radio frequency signal components which are 90° out of phase;
a first PIN diode having an anode operatively connectable with a radio frequency transmitter and a cathode operatively connected with the first coil;
a first quarter wave length cable for causing a 90° phase shift operatively connected between the first and second coils;
a second quarter wave length cable operatively connected between the second quadrature coil and an anode of a second PIN diode, the second PIN diode having a cathode operatively connected with ground, the second PIN diode anode being operatively connectable with a radio frequency receiver.

14. An interface comprising:
a first PIN diode having an anode operatively connectable with a radio frequency transmitter and a cathode operatively connected with a first port;
a first quarter wave length cable operatively connected between the first port and a second port;
a second quarter wave length cable operatively connected between the second port and an anode of a second PIN diode, the second PIN diode having a cathode operatively connected with ground, the second PIN diode anode being operatively connectable with a radio frequency receiver;
a third quarter wave length cable operatively connected with the first PIN diode anode;
a third PIN diode having an anode operatively connected with the third quarter wave length cable and a cathode operatively connected with ground; and,
a fourth quarter wave length cable operatively connected between the third quarter wave length cable and ground.

15. The interface as set forth in claim 14 further including biasing means for selectively applying a DC bias to the first, second, and third PIN diodes to bias the PIN diodes to a low radio frequency impedance state, such that:
the first PIN diode transmits a radio frequency signal to the first port;
the second port receives the radio frequency signal 90 degrees behind the first port;
the second quarter wave length cable appears as an open circuit; and
the third quarter wave length cable functions as a band pass filter.

16. The interface as set forth in claim 15 wherein the biasing means selectively biases the first, second, and third PIN diodes to a high radio frequency impedance state, such that
the first PIN diode blocks transmission of radio frequency signals therethrough;
the radio frequency signals from the first port lag radio frequency signals from the second port by 90 degrees;
the second quarter wave length cable conducts the received radio frequency signals from the first and second ports therethrough; and,
the third and fourth quarter wave cables form an effective half wave length cable which functions as a band stop filter.

17. A method of interfacing a transmitter, a receiver, and a common probe assembly which has first and second leads, the method comprising:
selectively providing radio frequency signals to the probe leads to establish a transmit mode and selectively blocking the passage of the radio frequency signals from the transmitter to the probe leads to establish a receive mode;
passing radio frequency signals received from the probe leads to the receiver in the receive mode and blocking the passage of radio frequency signals to the receiver in the transmit mode;
shifting the phase of the radio frequency signals between the first and second probe leads by a selected phase angle such that one lead leads the other by the selected phase angle in the transmit mode and lags the other lead by the selected phase angle in the receive mode.

18. The method as set forth in claim 17 further including selectively connecting the radio frequency signals from the transmitter with a band pass filter in the transmit mode and with a band stop filter in the receive mode.

19. The method as set forth in claim 18 wherein the selected phase shift is 90 degrees.

20. The method as set forth in claim 18 further including the step of biasing PIN diodes to a low radio frequency impedance state to establish the transmit mode and biasing the PIN diodes to a high radio frequency impedance state to establish the receive mode.

* * * * *